United States Patent [19]

Luther

[11] Patent Number: 5,117,201
[45] Date of Patent: May 26, 1992

[54] AUTOMATIC GAIN CONTROL APPARATUS FOR DIGITAL VARIABLE-GAIN AMPLIFIER

[75] Inventor: Rainer Luther, Duisburg, Fed. Rep. of Germany

[73] Assignee: Deutsche ITT Industries GmbH, Freiburg, Fed. Rep. of Germany

[21] Appl. No.: 669,160

[22] Filed: Mar. 14, 1991

[30] Foreign Application Priority Data

Mar. 23, 1990 [EP] European Pat. Off. ......... 90105500.4

[51] Int. Cl.⁵ .............................................. H03G 3/30
[52] U.S. Cl. ..................................... 330/279; 330/281
[58] Field of Search ............... 330/129, 253, 277, 279, 330/141, 281; 307/493, 494, 497

[56] References Cited

U.S. PATENT DOCUMENTS 3,464,022 8/1969 Locheed et al. ..................... 330/144
3,879,672 4/1975 Milanes ................................. 330/29
4,066,977 1/1978 Chambers et al. .................. 330/129
4,570,127 2/1986 Tanimoto et al. .............. 330/279 X
5,036,527 7/1991 Halin et al. ...................... 330/279 X

FOREIGN PATENT DOCUMENTS 0325252 1/1989 European Pat. Off. .
2166014 4/1986 United Kingdom .

*Primary Examiner*—Steven Mottola
*Attorney, Agent, or Firm*—Thomas L. Peterson

[57] ABSTRACT

Automatic gain control apparatus comprises a digitally adjustable amplifier, two threshold detectors with adjustable hysteresis, a latch and a control stage with an up/down counter. The latch stores only the logic states of the two threshold detectors. The digital output of the up/down counter is changed in value at the frequency of a first or second clock signal. The output of the up/down counter controls the gain of the amplifier.

19 Claims, 2 Drawing Sheets

AUTOMATIC GAIN CONTROL APPARATUS FOR DIGITAL VARIABLE-GAIN AMPLIFIER

FIELD OF THE INVENTION

The present invention relates in general to automatic gain controlled amplifiers and in particular to apparatus that automatically adjusts the gain of a digital variable-gain amplifier.

BACKGROUND OF THE INVENTION

A conventional automatic gain controlled (AGC) amplifier includes a digital variable-gain amplifier that amplifies an input signal, a detector that detects the amplitude of the amplified signal provided by the amplifier, and a control circuit that compares the detected amplitude with a reference voltage and then adjusts the gain of the amplifier such that the detected amplitude does not exceed the reference voltage.

The input signal is an AC analog signal that can be provided with a DC bias. The AGC circuit makes it possible to utilize the control characteristics of an analog to digital converter in order to optimize the resolution of a digitized signal. A tolerance band is specified in which the signal amplitude should lie. The width of the tolerance band, the hysteresis zone, depends upon the shape of the analog signal. A narrower hysteresis zone can be used with a higher frequency signal. In the case of audio signals, in which the AC signal is mixed with a carrier signal, the hysteresis zone is chosen such that the automatic gain control does not respond to ordinary, short-time signal variations, which would lead to distortions.

European Patent Application EP-A-325 252 filed on Jan. 19, 1989 discloses an automatic gain control circuit with a digitally adjustable amplifier. The output of the amplifier is coupled to a peak-value sample-and-hold circuit whose analog output is evaluated by means of a window comparator. The hysteresis range of this window comparator is determined by two reference voltages each of which is applied to the reference input of one of two comparators included in the window comparator. The outputs of the two comparators are applied to a control stage which produces a digital control signal for the digitally adjustable amplifier by means of an up-down counter. Different sampling rates can be set by means of two applied clock signals.

Among the disadvantages of this prior art circuit, it is not suited for implementation in monolithic integrated MOS technology, particularly without external components. At the relatively low sampling rates, the holding of the sampled analog voltage values requires high memory capacities, which are hardly realizable in view of the amount of chip area required.

Further, this conventional circuit requires a costly and complicated peak-value sample and hold stage. The circuit employs capacitors and resistors in the peak-value sample and hold stage. The capacitors and resistors dictate the speed at which the gain is adjusted. Drivers are required to reverse charges that are stored on capacitors. Speed of adjustment is also dictated by the nature of the input signal.

Therefore, it is an object of the present invention to provide automatic gain control apparatus which is suitable for MOS integration, particularly CMOS integration, and whose holding device requires no storage capacitors.

It is a further object of the present invention to eliminate the peak-value sample and hold circuit of the prior art.

SUMMARY OF THE INVENTION

Automatic gain control apparatus is provided to automatically adjust the gain of a variable-gain amplifier. The amplifier provides an amplified signal in response to an input signal. The apparatus comprises threshold detection means, responsive to said amplifier, for providing an output signal when the amplitude of the amplified signal falls within a hysteresis region; latch means, responsive to the threshold detection means, for indicating whether the output signal is provided by the threshold detection means during a sampling period; memory means, responsive to the latch, for storing the contents of the latch; and varying means, responsive to the memory means, for varying the gain of the amplifier means in accordance with the contents of the latch as stored in the memory means.

A preferred embodiment of the threshold detection apparatus, which is implemented in CMOS technology, comprises first and second transconductance amplifier means, first and second current-difference stages and a NAND gate. The first transconductance amplifier means includes first and second nchannel transistors that have their respective sources coupled together. The input signal is applied to the gate of the first n-channel transistor, and a first reference signal is applied to the gate of the second n-channel transistor. The first transconductance amplifier means further includes a third n-channel transistor, which provides a constant-current source, the drain-source path of the third n-channel transistor being connected to the coupled sources of the first and second n-channel transistors.

The first current-difference stage has its first and second inputs coupled to the respective drains of the first and second n-channel transistors.

The second transconductance amplifier means includes first and second p-channel transistors that have their respective sources coupled together. The input signal is applied to the gate of the second p-channel transistor, and a second reference signal is applied to the gate of the first p-channel transistor. The second transconductance amplifier means further includes a third p-channel transistor, which provides a constant-current source, the drain-source path of the third p-channel transistor being connected to the coupled sources of the first and second p-channel transistors.

The second current-difference stage has its first and second inputs coupled to the drains of the first and second p-channel transistors, respectively. The NAND gate has its respective inputs coupled to outputs of the first and second current-difference stages. The output of the NAND gate provides the output of the threshold detection means.

DETAILED DESCRIPTION OF THE FIGURES

Figure 1:
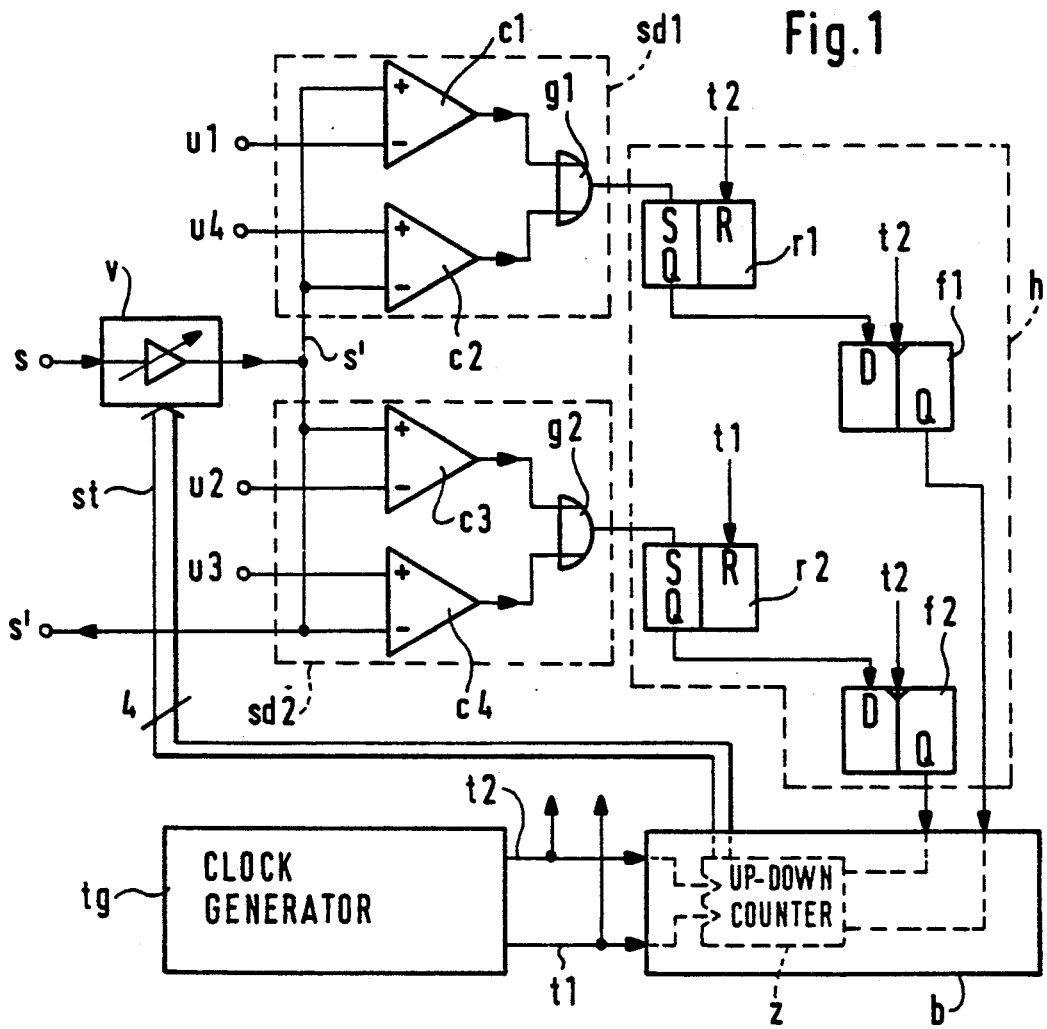
FIG. 1 is a block diagram of AGC apparatus in accordance with the present invention.

Referring now to FIG. 1, there is shown an AGC amplifier in accordance with the present invention. The AGC amplifier includes a digital variable-gain amplifier V, first and second threshold detection circuits sd1 and sd2, a latch h and control stage b. An analog input signal s is fed to an input of the variable gain amplifier V, which outputs an amplified signal s' to the first and second threshold detectors sd1 and sd2. The first and second threshold detectors sd1 and sd2 determine whether the amplitude of the amplified signal s' falls within a first range defined between threshold references U2 and U3, a second range defined between threshold references U1 and U2, and U3 and U4, respectively, and a third range exceeding threshold references U1 and U4, respectively (see FIG. 2). The outputs of the first and second threshold detectors sd1 and sd2 are sampled in the latch h. The contents of latch h, which contents indicate the range into which the amplified signal s' falls, are fed into the control stage b. If the amplified signal s' falls in the first range U2-U3, the control stage b increases the gain of the variable gain amplifier V. If the amplified signal s' falls within the second range U1-U2 or U3-U4, the gain of the variable gain amplifier V is not changed. If the amplified signal s' exceeds either threshold reference U1 or U4, the control stage b decreases the gain of the variable gain amplifier V.

The variable-gain amplifier v has a gain that is digitally adjustable. A control input to the amplifier v is supplied with a control signal st, which adjusts the gain. The control signal st comprises four bits, which four bits allow the gain of the amplifier v to be adjusted in sixteen different steps.

The first threshold detector sd1 includes first and second comparators c1 and c2, and the second threshold detectors sd2 includes third and fourth comparators c3 and c4. The non-inverting or minuend input of the first and third comparators c1 and c3 and the inverting or subtrahend inputs of the second and fourth comparators c2 and c4 are connected to the output of the variable-gain amplifier v. The inverting inputs of the first and third comparators c1 and c3 are fed with the first threshold reference u1 and the second threshold reference u2, respectively. The non-inverting inverting inputs of the fourth and second comparators c4 and c2 are fed with the third threshold reference u3 and the fourth threshold reference u4, respectively. The threshold references u1, u2, u3 and u4 define the two hysteresis zones. If the input signal s is a DC signal, the two hysteresis zones will be symmetrical about the DC value level. In each of the two threshold detectors sd1 and sd2, the two comparator output signals are logically combined by OR gates g1 and g2, respectively. Although the embodiment of FIG. 3 uses NAND gates, in which the outputs of the four comparators c1 through c4 are inverted before being combined, the two embodiments are logically equivalent.

In latch h, the output signals from the first and second threshold detectors sd1 and sd2 are sampled at different rates, which rates are controlled by first and second clock signals t1 and t2. The output of the first threshold detector sd1 is coupled to the set input S of a first RS flip-flop r1. The reset input R of the first RS flip-flop r1 is supplied with the second clock signal t2. Similarly, the output of the second threshold detector sd2 is coupled to the set input S of a second RS flip-flop r2. The reset input R of the second RS flip-flop r2 is supplied with the first clock signal t1. The non-inverted outputs Q of the first and second RS flip-flops r1 and r2 are coupled to the inputs D of a first delay flip-flop f1 and a second delay flip-flop d2, respectively. The clock input of the first delay flip-flop f1 is supplied with the second clock signal t2, and the clock input of the second delay flip-flop f2 is supplied with either the first or second clock signal t1 or t2. The sampling interval is determined by the period of the lower-frequency first clock signal t1. Only if all amplitude peaks of the signal s' lie within the second and third threshold references u2, u3 will the gain be increased.

The storage function of the latch h can also be implemented by random-access memory (RAM), which is overwritten or erased in a contention mode by the output signals from the first and second threshold detectors sd1 and sd2 and the first and second clock signals t1 and t2. The respective memory contents then provide the input signal for the control stage b.

The control stage b includes an up/down counter z. The non-inverted outputs Q of the first and second delay flip-flops f1 and f2 are coupled to respective inputs of the up/down counter z. Depending on the logic states of the output signals provided by the first and second delay flipflops f1 and f2, the count of the up/down counter z is incremented, decremented or left unchanged. If the first and second delay flip-flops d1 and d2 provide output signals, the up/down counter z is decremented, whereby the gain of the amplifier v is reduced. If only the second delay flip-flop d2 provides an output signal, the up/down counter z is left unchanged, whereby the gain of the amplifier v is left unchanged. If neither the first or second delay flip-flops d1 or d2 provides an output signal, the up/down counter z is incremented, whereby the gain of the amplifier v is increased. The up/down counter z can be realized by a person skilled in the art.

The up/down counter is controlled by the first and second clock signals t1 and t2. The first and second clock signals t1 and t2 have of different clock frequencies, with the second clock signal having a higher frequency than the first. The amplitude of a large amplified signal s' must be reduced quickly, so that the amplified signal s' will quickly get out of the overload range with high harmonic distortion. Thus, if the amplitude of the amplified signal s' exceeds either the first or fourth threshold reference u1 or u4, the gain of the amplifier v is reduced at the second clock frequency. By contrast, the amplitude increase takes place slowly, so that several signal peaks can be detected and evaluated in the measurement interval even in the case of low-frequency signals. Thus, the gain of the amplifier v is increased at the first clock frequency.

The first and second clock signals t1 and t2 are provided by a clock generator tg. The choice of the clock frequencies of the first and second clock signals t1 and t2 is governed by the following considerations. If the frequency of the second clock signal t2 is too high, there will be the risk of too many clock pulses falling into the signal peaks, so that the latter will be deformed by the fast amplitude reduction and harmonic distortion will occur. If the frequency of the second clock signal t2 is too low, the amplitude reduction will take too long and the signal will remain in the overload range too long. Experiments show that a frequency in the range of 500 Hz to 2 kHz represents a good compromise for the second clock signal t2.

The frequency of the first clock signal t1 is selected to be lower than the second clock signal t2 by a factor of at least 100 to 1000. Experiments show that the frequency range from 0.5 Hz to 2 Hz represents a good compromise for the first clock signal t1. For the implementation of the clock generator tg, a frequency division factor of $2^{10}$ is advantageous. In that case, the lower-frequency first clock signal t1 can be derived from the higher-frequency second clock signal t2 by a simple binary frequency divider, such as a module counter.

The AGC amplifier illustrated in the block diagram of FIG. 1 can be realized from MOS, bipolar, discrete, or even hybrid technology. However, the advantages of the invention will be realized if the present invention is implemented as a monolithic integrated circuit, because the entire arrangement represents a compact sub-unit without external terminals on the chip surface of the overall circuit. The choice of n-channel, p-channel, or CMOS technology depends on other factors, such as the predetermined processing speed of the overall circuit.

Figure 2:
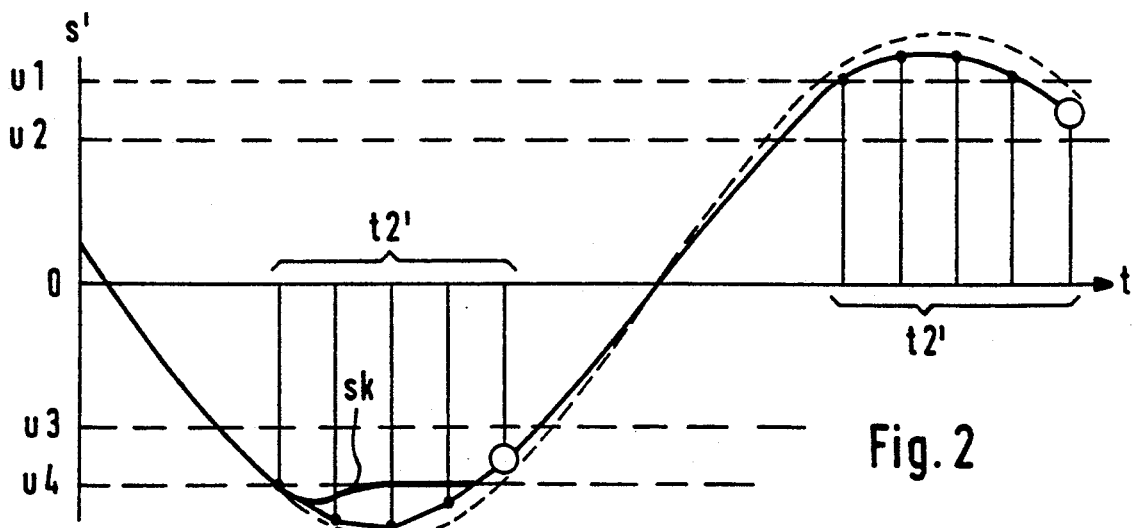
FIG. 2 is an illustration of a waveform of an analog input signal and an output signal amplified in accordance with the present invention.

FIG. 2 shows the waveform of an amplified signal s' whose amplitude exceeds the threshold references u1 and u4. It can be seen that of the two hysteresis ranges, the first and fourth threshold references u1 and u4 (outer limit values) are assigned to the first threshold detector sd1, and the second and third threshold references u2 and u3 (inner limit values) are assigned to the second threshold detector sd2. In the ranges labelled t2', the necessary amplitude reduction is effected at the frequency of the second clock signal t2. The pulses of the second clock signal t2 are shown schematically as vertical lines with a small circle. The small circle indicates that the amplifier v is decreasing its gain, and the large circle indicates that the gain remains constant. The dashed line represents the waveform without gain reduction. It is also readily apparent from the time chart that at too high a frequency of the second clock signal t2, the amplified signal s' would be hard-limited as shown by the portion sk of the waveform.

Figure 3:
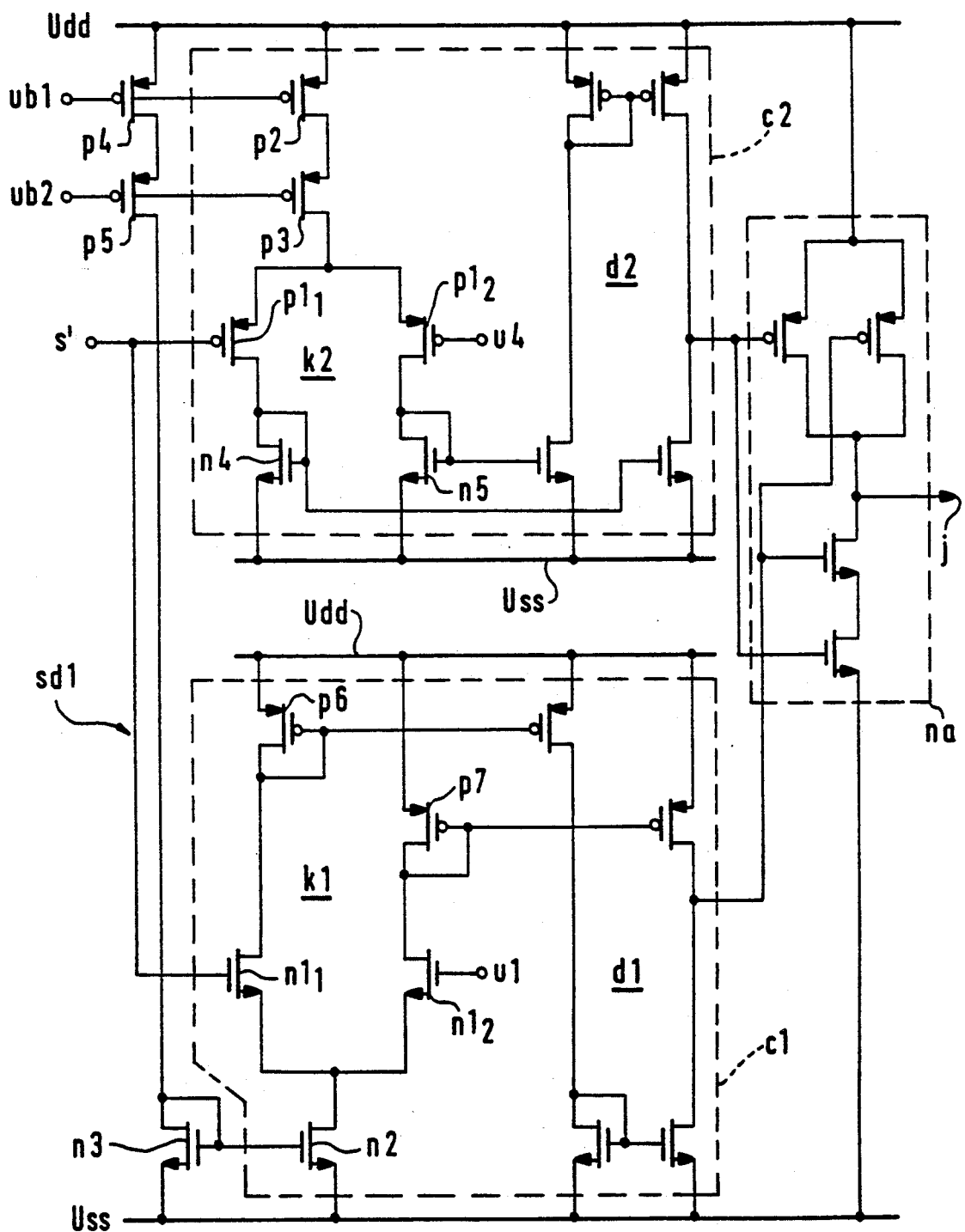
FIG. 3 is a schematic diagram of a preferred embodiment of a threshold detector in accordance with the present invention.

Referring now to FIG. 3, there is shown a preferred embodiment of the first threshold detector sd1, which is realized in CMOS technology. The first and second comparators c1 and c2 are formed by first and second transconductance amplifiers k1 and k2, respectively. The non-inverting input of the first transconductance amplifier k1 and the inverting input of the second transconductance amplifier k2 is supplied with the amplified analog signal s'. The inverting input of the first transconductance amplifier k1 is supplied with the first threshold reference u1 and the non-inverting input of the second transconductance amplifier k1 is supplied with the fourth threshold reference u4. The outputs of the first and second transconductance amplifiers k1 and k2 are coupled to first and second current-difference stages d1 and d2, respectively. The outputs of the first and second current-difference stages d1 and d2 provide the first and second comparator output signals, respectively, which are coupled to respective inputs of the NAND gate na. The output of the NAND gate provides the output of the first threshold detector sd1.

The input stage of the first transconductance amplifier k1 consists of a pair of first n-channel transistors $n1_1$ and $n1_2$ whose common source terminal is connected to a negative supply voltage Uss via an second nchannel transistor n2, which provides a current source. The input stage of the second transconductance amplifier k2 consists of a pair of first p-channel transistors $p1_1$ and $p1_2$ pair whose common source terminal is connected to a positive supply voltage Udd via second and third p-channel transistors p2 and p3, which form a cascode current source. The bias of the cascode current source is adjusted by applying first and second biasing voltages ub1 and ub2 to the respective gates of the second and third p-channel transistors p2 and p3. A second cascode current source is provided by fourth and fifth p-channel transistors p4 and p5, whose biases are adjusted by applying the first and second biasing voltages ub1 and ub2 to their respective gates. The fourth p-channel transistor p4 is connected to the positive supply voltage Udd. A third n-channel transistor n3, which provides a current mirror, is connected between the fifth p-channel transistor p5 and the negative supply voltage Uss. The third n-channel transistor n3 also functions as a current source for the first transconductance amplifier k1. The outputs the first transconductance amplifier k1 are coupled to respective inputs of the first current-different stage d1 by respective p-channel transistors p6 and p7, which provide current mirrors. Also, the respective drains of the pair of first n-channel transistors $n1_1$ and $n1_2$ are connected to the respective inputs of the first current-different stage d1. The outputs the second transconductance amplifier k2 are coupled to respective inputs of the second current-different stage d2 by respective n-channel transistors n4 and n5, which also provide current mirrors. Also, the respective drains of the pair of first p-channel transistors $p1_1$ and $p1_2$ are connected to the respective inputs of the second currentdifferent stage $d_2$.

The second threshold detector sd2 is realized in the same manner as the first threshold detector sd1, except that the second threshold reference u2 is applied to the subtrahend input of the third comparator c3, and the third threshold reference u3 is applied to the minuend input of the fourth comparator c4.

Thus disclosed is an AGC apparatus that evaluates two symmetrical hysteresis ranges by means of the first and second threshold detectors sd1 and sd2. This measurement technique is particularly advantageous if the analog input signal s deviates from an ideal sinusoidal shape, as is usually the case with audio signals. The amplitude determination on two hysteresis zones offers advantages with regard to uniform control action.

The AGC apparatus does not require a peak-value sample-and-hold circuit for the analog signal s since the first and second threshold detectors sd1 and sd2 are supplied directly with the analog signal s. Instead of the costly and complicated peak-value sample-and-hold circuit, only a simple digital hold circuit, latch h, is necessary for storing the binary output signals from the first and second threshold detectors sd1 and sd2. Because only logic states have to be stored, driver circuits are not required for reversing the charges on storage capacitors in the peak-value sample-andhold circuit.

It will be understood that the embodiments described herein are merely exemplary and that a person skilled in the art may make many variations and modifications without departing from the spirit and scope of the invention. All such modifications are intended to be included within the scope of the invention as defined in the appended claims.

I claim:

1. Automatic gain control apparatus for automatically adjusting the gain of a variable-gain amplifier, said amplifier providing an amplified signal in response to an input signal, said apparatus comprising:

threshold detection means, responsive to said amplifier, for providing an output signal when the amplitude of said amplified signal falls within a hysteresis region;

latch means, responsive to said threshold detection means, for indicating whether said output signal is provided by said threshold detection means during a sampling period;

memory means, responsive to said latch means, for storing the contents of said latch means; and varying means, responsive to said memory means, for varying said gain of said amplifier means in accordance with the contents of said latch means as stored in said memory means and including means for decreasing the gain of said amplifier substantially more rapidly than said gain is increased.

2. Apparatus according to claim 1, wherein said latch means includes timing means for providing a first clock signal; and an RS flip-flop having its set input supplied with said output signal provided by said threshold means and its reset input provided with said first clock signal.

3. Apparatus according to claim 2, wherein said timing means further provides a second clock signal; and wherein said memory means includes a delay flip flop having its input coupled to an output of said RS flip flop and its clock input provided with said second clock signal, the period of said second clock signal establishing the duration of said sampling period.

4. Apparatus according to claim 3, wherein said first clock signal has a higher frequency than said second clock signal, whereby said RS flip-flop samples more than one amplified signal before said contents are outputted to said delay flip-flop.

5. Apparatus according to claim 3, wherein said amplifier has a control input at which input said gain is digitally controlled, and wherein said varying means includes an up ®down counter having an output coupled to said control input of said amplifier and having an input coupled to an output of said delay flip-flop.

6. Apparatus according to claim 5, wherein said hysteresis region of said threshold detection means is adjustable.

7. Apparatus according to claim 6, wherein said threshold detection means includes first and second comparators, said amplified signal being supplied to minuend and subtrahend inputs of said first and second comparators, respectively, a first reference signal being supplied to the subtrahend input of said first comparator, a second reference signal being applied to the minuend input of said second comparator; and an OR gate, the outputs of said first and second comparators being coupled to respective inputs of said OR gate, whose output provides said output of said threshold detection means.

8. Apparatus according to claim 6, wherein said threshold detection means includes:

first transconductance amplifier means including first and second n-channel transistors that have their respective sources coupled together, said input signal being applied to the gate of said first n-channel transistor, a first reference signal being applied to the gate of said second n-channel transistor, said first transconductance amplifier means further including a third n-channel transistor, which provides a constant-current source, the drain-source path of said third n-channel transistor being connected to said coupled sources of said first and second nchannel transistors;

a first current-difference stage having first and second inputs coupled to the respective drains of said first and second n-channel transistors;

second transconductance amplifier means including first and second p-channel transistors that have their respective sources coupled together, said input signal being applied to the gate of said second p-channel transistor, a second reference signal being applied to the gate of said first p-channel transistor, said second transconductance amplifier means further including a third p-channel transistor, which provides a constant-current source, the drain-source path of said third p-channel transistor being connected to said coupled sources of said first and second pchannel transistors;

a second current-difference stage having first and second inputs coupled to the drains of said first and second p-channel transistors, respectively; and a NAND gate having its respective inputs coupled to outputs of said first and second current-difference stages, and its output providing the output of said threshold detection means.

9. Automatic gain control apparatus for automatically adjusting the gain of a variable-gain amplifier, said amplifier providing an amplified signal in response to an input signal, said circuit comprising:

first threshold detection means, responsive to said amplifier, for providing a first output signal when the amplitude of said amplified signal falls within a first hysteresis region;

first latch means, responsive to said first threshold detection means, for indicating whether said first output signal is provided by said first threshold detection means during a first sampling period;

second threshold detection means, responsive to said amplifier, for providing a second output signal when the amplitude of said amplified signal falls within a second hysteresis region;

second latch means, responsive to said second threshold detection means, for indicating whether said second output signal is provided by said second threshold detection means during a second sampling period;

memory means, responsive to said first and second latch means, for storing the respective contents of said first and second latch means; and varying means, responsive to said memory means, for varying said gain of said amplifier means in accordance with the contents of said first and second latch means as stored in said memory means and including means for decreasing the gain of said amplifier substantially more rapidly than said gain is increased.

10. Apparatus according to claim 9, further including timing means for providing first and second clock signals; wherein said first latch means includes a first RS flip-flop having its set input supplied with said first output signal, which is provided by said first threshold means, and its reset input supplied with said first clock signal; and wherein said second latch means includes a second RS flip-flop having its set input supplied with said second output signal, which is provided by said second threshold means, and its reset input supplied with said second clock signal.

11. Apparatus according to claim 10, wherein said memory means includes first and second delay flip-flops, said first flip-flop having its input coupled to an output of said first RS flip-flop and its clock input provided with said second clock signal, said second flip-flop having its input coupled to an output of said second RS flip-flop and its clock input provided with said second clock signal, the period of said second clock signal establishing the durations of said first and second sampling periods.

12. Apparatus according to claim 11, wherein said second clock signal has a higher frequency than said first clock signal.

13. Apparatus according to claim 12, wherein said amplifier has a control input at which input said gain is digitally controlled, and wherein said varying means includes an up&down counter having an output coupled to said control input of said amplifier and having respective inputs coupled to outputs of said first and second delay flip-flops.

14. Apparatus according to claim 13, wherein said first and second hysteresis regions of said first and second threshold detection means, respectively, are adjustable.

15. Apparatus according to claim 14, wherein said first threshold detection means includes first and second comparators and a first gate, the outputs of said first and second comparators being coupled to respective inputs of said first gate, the output of said first gate providing said first output signal; wherein said second threshold detection means includes third and fourth comparators and a second gate, the outputs of said third and fourth comparators being coupled to respective inputs of said second gate, the output of said second gate providing said second output signal; wherein an output of said amplifier is coupled to the minuend inputs of said first and said third comparators, and to the subtrahend inputs of said second and said fourth comparators, wherein a first threshold reference is applied to the subtrahend input of said first comparator, a second threshold reference is applied to the minuend input of said second comparator, a third threshold reference is applied to the subtrahend input of said third comparator and a fourth threshold reference is applied to the minuend input of said fourth comparator.

16. Apparatus according to claim 15, wherein said first and second gates are OR gates.

17. Apparatus according to claim 15, wherein said outputs of said first, second third and fourth comparators are inverted and wherein said first and second gates are NAND gates.

18. Apparatus according to claim 14, wherein each one of said first and second threshold detection means includes:
first transconductance amplifier means including first and second n-channel transistors that have their respective sources coupled together, said input signal being applied to the gate of said first n-channel transistor, a first reference signal being applied to the gate of said second n-channel transistor, said first transconductance amplifier means further including a third n-channel transistor, which provides a constant-current source, the drain-source path of said third n-channel transistor being connected to said coupled sources of said first and second nchannel transistors;
a first current-difference stage having first and second inputs coupled to the respective drains of said first and second n-channel transistors;
second transconductance amplifier means including first and second p-channel transistors that have their respective sources coupled together, said input signal being applied to the gate of said second p-channel transistor, a second reference signal being applied to the gate of said first p-channel transistor, said second transconductance amplifier means further including a third p-channel transistor, which provides a constant-current source, the drain-source path of said third p-channel transistor being connected to said coupled sources of said first and second pchannel transistors;
a second current-difference stage having first and second inputs coupled to the drains of said first and second p-channel transistors, respectively; and
a NAND gate having its respective inputs coupled to outputs of said first and second current-difference stages, and its output providing the output of said threshold detection means.

19. Threshold detection apparatus, implemented in CMOS technology, for providing an output signal when the amplitude of an input signal provided thereto falls within a hysteresis region, comprising:
first transconductance amplifier means including first and second n-channel transistors that have their respective sources coupled together, said input signal being applied to the gate of said first n-channel transistor, a first reference signal being applied to the gate of said second n-channel transistor, said first transconductance amplifier means further including a third n-channel transistor, which provides a constant-current source, the drain-source path of said third n-channel transistor being connected to said coupled sources of said first and second nchannel transistors;
a first current-difference stage having first and second inputs coupled to the respective drains of said first and second n-channel transistors;
second transconductance amplifier means including first and second p-channel transistors that have their respective sources coupled together, said input signal being applied to the gate of said second p-channel transistor, a second reference signal being applied to the gate of said first p-channel transistor, second transconductance amplifier means further including a third p-channel transistor, which provides a constant-current source, the drain-source path of said third p-channel transistor being connected to said coupled sources of said first and second p-channel transistors;
a second current-difference stage having first and second inputs coupled to the drains of said first and second p-channel transistors, respectively; and
a NAND gate having its respective inputs coupled to outputs of said first and second current-difference stages, and its output providing the output of said threshold detection means.

* * * * *